United States Patent [19]

Crane et al.

[11] Patent Number: 4,638,481
[45] Date of Patent: Jan. 20, 1987

[54] METHOD AND APPARATUS FOR GENERATING SEQUENCE OF MULTIBIT WORDS

[75] Inventors: Michael P. Crane; David J. Marsh, both of Poole, England

[73] Assignee: Membrain Limited, Wimborne, England

[21] Appl. No.: 665,240

[22] Filed: Oct. 26, 1984

[30] Foreign Application Priority Data

Oct. 28, 1983 [GB] United Kingdom ............... 8328880

[51] Int. Cl.[4] ........................................ G01R 31/28
[52] U.S. Cl. ...................................... 371/27; 364/900
[58] Field of Search .......................... 371/27, 20, 21; 324/73 R, 73 AT, 73 PC; 364/900

[56] References Cited

U.S. PATENT DOCUMENTS

| | | | |
|---|---|---|---|
| 3,873,818 | 3/1975 | Barnard | 371/27 X |
| 4,045,736 | 8/1977 | Carpenter et al. | 324/73 R |
| 4,433,414 | 2/1984 | Carey | 371/27 |
| 4,493,079 | 1/1985 | Hughes, Jr. | 371/27 |
| 4,538,268 | 8/1985 | Van Cang | 371/20 |
| 4,555,663 | 11/1985 | Shimizu | 324/73 R |

Primary Examiner—Charles E. Atkinson
Attorney, Agent, or Firm—Ladas & Parry

[57] ABSTRACT

In automatic test equipment the logical levels on certain of the test pins are set to 0 and 1 by corresponding flip-flops included in respective I/O logic circuits. The states of the flip-flops (as well as other factors) are controlled by commands read out of a control RAM which is of sufficient width to provide a 4-bit command on lines for each logic circuit. The available commands include NOP commands and change commands which toggle the states of the corresponding flip-flops. A relatively small number of addresses of the control RAM have change commands entered in correspondence with selected ones of the pins. By repeatedly reading out the commands in these addresses in a non-cyclic sequence it is possible to generate a succession of different states of the flip-flops in the logic, which succession is much longer than the number of addresses of the control RAM which are utilized. Apparatus for establishing the correct addressing sequence is described.

9 Claims, 8 Drawing Figures

| | | | | | |
|---|---|---|---|---|---|
| NOP | NOP | NOP | NOP | CH | 1 |
| NOP | NOP | NOP | CH | CH | 2 |
| NOP | NOP | CH | CH | CH | 3 |
| NOP | CH | CH | CH | CH | 4 |
| CH | CH | CH | CH | CH | 5 |
| P3 | P8 | P5 | P11 | P12 | PIN ASS. |

| PIN | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| (1) | | | NOP | | NOP | | | NOP | | | NOP | CH | | | | |
| (2) | | | NOP | | NOP | | | NOP | | | CH | CH | | | | |
| (3) | | | NOP | | CH | | | NOP | | | CH | CH | | | | |
| (4) | | | NOP | | CH | | | CH | | | CH | CH | | | | |
| (5) | | | CH | | CH | | | CH | | | CH | CH | | | | |

| | | | | | |
|---|---|---|---|---|---|
| NOP | NOP | NOP | NOP | CH  | (1) |
| NOP | NOP | NOP | CH  | NOP | (2) |
| NOP | NOP | CH  | NOP | NOP | (3) |
| NOP | CH  | NOP | NOP | NOP | (4) |
| CH  | NOP | NOP | NOP | NOP | (5) |

FIG. 8

METHOD AND APPARATUS FOR GENERATING SEQUENCE OF MULTIBIT WORDS

FIELD OF THE INVENTION

The present invention relates to a machine method and apparatus for generating a sequence of multibit words selected from a set of N of the words. N may be a fairly large integer, such as of the order of 1,000. The invention is particularly, but not exclusively, applicable in automatic test equipment and, as a background of the invention, a particular problem which arises with such equipment will be explained in some detail.

DESCRIPTION OF THE PRIOR ART

In order to automate the testing of complex electrical circuits it is known to provide test equipment with a plurality of pins which contact selected points in the unit under test (UUT). With each pin there is associated input/output circuitry and control logic enabling the pin to be used either to supply a binary test input or sense the level at the corresponding circuit point. It is necessary that the test equipment can be readily configured to test a wide variety of different circuits and, to this end, it is known to use a random access memory to store a test sequence. For each RAM address the memory holds a set of command words, one for each pin. These words may be of 4 bits and, for a typical complement of 512 pins, a large RAM, 2048 bits wide, is needed. 4-bit control words enable upto 16 different commands to be assigned to any pin, including a no operation (NOP) command which will typically be 0000. Other commands will determine whether the pin is used for input or output purposes, whether pin is at level 0 or level 1, and so on.

The input/output circuitry for a pin includes a high-/low flip-flop which will be referred to as the H/L flip-flop and which determines the level on an input pin. It is known to include in the set of commands which can be stored in the RAM a change command which simply toggles the corresponding H/L flip-flop. The use of such a command can simplify the setting up of many test sequences.

The problem with which the present invention is primarily concerned arises when it is desired to apply a long sequence of test signals to an arbitrarily selected plurality of the pins. This may be referred to as a sequence of test words. A test word is a multibit word which consists of a group of bits to be applied to the selected pins respectively. When use is made of change commands, each test word may be generated from the preceding test word by use of a change word which consists of a particular combination of CH=change commands and NOP commands. The problem in question arises, for example, when the UUT includes a memory with many addresses, every one of which has to be tested. In order to avoid possible confusion, the memory in the UUT will be called the UUT memory, whereas the memory which stores the commands for setting up the test words will be called the control memory, or the control RAM. As one specific example, a UUT memory with 16 address bits has 64K addresses. It would be possible to achieve the required test sequence by using a large enough control RAM in the test equipment, this RAM having enough addresses to step through all of the memory addresses of the UUT, i.e. being large enough to store 64K command words. This solution is not practical because it requires a very large control RAM, e.g. 2048 bits wide and 64K bits deep. Such a control memory would be expensive and unnecessarily tedious to program for each UUT.

On the other hand, there is no problem in providing the required address signals for any number of pins, utilising a high speed binary counter which steps through all of the address numbers and provides the address bits at outputs of its binary stages. The problem which then arises is how to allocate the address bits to the required pins, which are an arbitrary selection of say 16 pins from the total number of say 512. It is extremely undesirable to perform the required allocation by any kind of patching technique which would be very difficult to implement and would take away one of the major virtues of the equipment as described above, namely the ability to adapt to different UUTs by software changes rather than hardware changes. In GB No. 2,099,618 there is an output counter and there are two modes of operation. In the first, words are dumped into the counter from a vector memory and no question of change signals arises. The second mode is used when sequential words are required and these are obtained by incrementing the counter. This arrangement suffers from the above-noted problem.

In EP No. 0,087,011 sequences of microwords are generated and selected portions of the sequences can be repeated a desired number of times. In EP No. 0,089,469 the effective number of control words is increased by separate decoding of different fields. Neither of these proposals represents a solution to the problems discussed above.

PROBLEM TO BE SOLVED

The object of the present invention is to provide a method of generating a sequence of multibit words which can be used, inter alia, to overcome the problems described above, that is to say a method which will provide a large number of test words using a small control RAM but will retain flexibility of assignment of word bits with the need for physical patching.

THE INVENTION

According to the present invention, there is provided a machine method of generating a sequence of m-bit multibit words selected from a set N of the words, wherein the words are formed in succession in a plurality m of bistable devices, each fresh word being formed by applying change commands to selected ones of the bistable devices to change the state thereof, characterised in that the change signals are stored as a set n of change words, each of which consists of a corresponding selection of change commands, n being a plural integer smaller than N, and the said sequence of multibit words being established by means of a corresponding sequence of change words.

OPERATION OF THE INVENTION

In automatic test equipment, the multibit words may be test words as defined above. The invention makes use of the fact that a large set of test or other multibit words be generated using a much smaller set of change words. In general, a set of $N=2^m$ test words may require only $n=m$ change words. This is illustrated in a very simple example below when $N=32=2^5$ and $n=5$. The contrast is more dramatic when m is larger. When $N=65536$ $(64K)=2^{16}$, $n=16$. Such a small number of test words can only be employed when the sequence of test words is suitably ordered but the invention is not restricted to an ordered binary sequence of test words. As will be shown below it is applicable, as one further example, to test words in Gray code. It is a particular advantage of the invention, as utilized in automatic test equipment, that a long sequence of test words for an arbitrary selection of the test pins, may be achieved merely by writing the appropriate commands into a relatively small block of control RAM, and then addressing this control RAM block appropriately.

The examples given below will also show that the required addresses do not, except possibly in a special case, follow a simple cyclic sequence. An important development of the invention is concerned with the way in which the address sequence is generated. The address sequence could be determined algorithmically but this would be very slow. For example, if $N=2^{16}$, sixteen nested sub-routines would be required to implement the algorithm for an ordered binary or Gray code sequence of test words.

According to the development of the invention, the readout addresses of the stored change words are provided by decoding predetermined states of a continuously clocked counter, each of the n change word addresses being generated in response to a corresponding predetermined state.

BRIEF DESCRIPTION OF THE DRAWINGS

Other developments of the invention and apparatus according to the invention are defined in the appended claims.

The invention will be described in more detail, by way of example, with reference to the accompanying drawings, in which:

FIG. 8 shows a modification of FIG. 5 for generation of a Gray code sequence of test words.

DESCRIPTION OF EMBODIMENTS OF THE INVENTION

Figure 1:
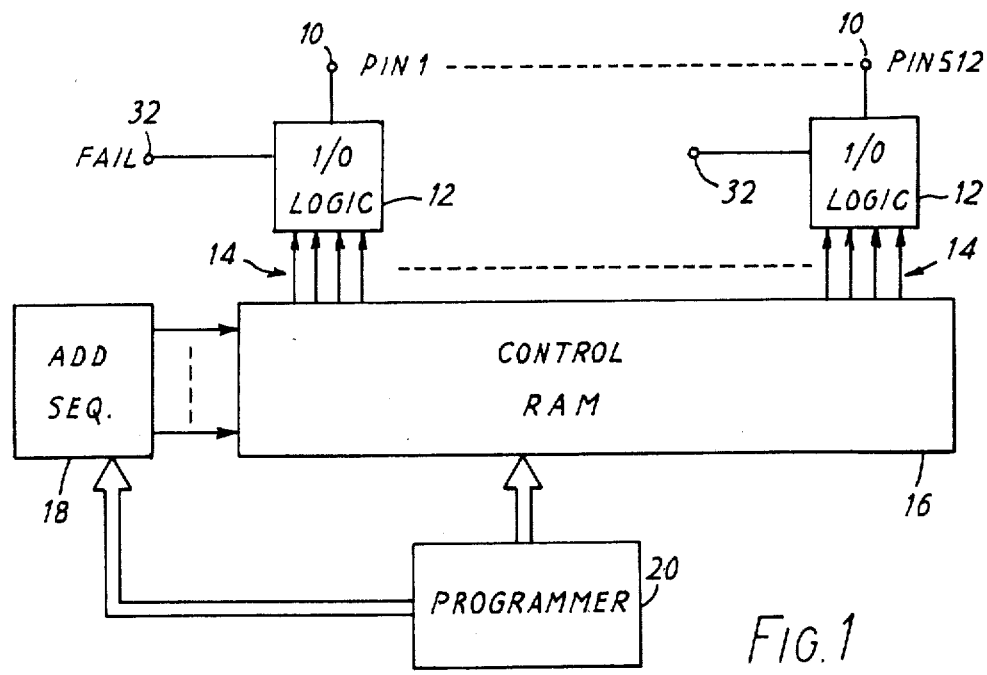
FIG. 1 is a schematic block diagram of an automatic test equipment in which the invention may be embodied.

FIG. 1 is a schematic block diagram illustrating in a very broad way the essentials of a known automatic test equipment in which the present invention may be embodied. The equipment has say 512 test pins 10 labelled PIN 1 to PIN 512. With each pin 10 there is associated input/output logic 12 which is used, in each step of the test sequence, either to apply a test level (0 or 1) to the corresponding pin or to sense the level of the pin. Each I/O logic 12 is controlled by four lines 14 which are four of the 2048 data lines of a control RAM 16 having a width of 2048 bits and a depth sufficient to store the required command words for effecting the test sequences.

The addresses of the control RAM 16 are selected by an address sequencer 18 which is controlled by a programmer 20. The programmer 20 will normally be implemented by a computer or microprocessor provided with the appropriate peripherals for communication with an operator and with one or more data storage devices, printers etc. The programmer 20 is used when setting up the equipment to write the appropriate pattern of commands into the control RAM 16. During peformance of tests, the programmer supervises the test sequence in general and the operation of the address sequencer 18 in particular.

Figure 2:
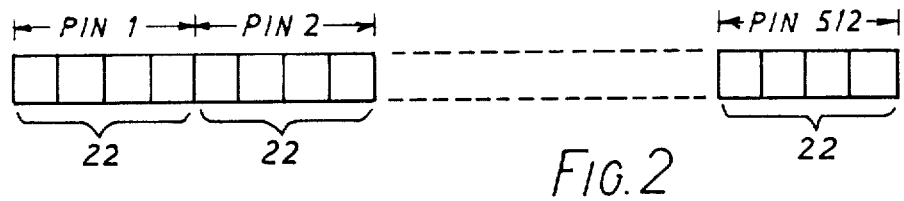
FIG. 2 illustrates one control RAM address of the automatic test equipment.

FIG. 2 shows one address of the control RAM 16, consisting of 512 4-bit cells 22, one for each pin. The four bits in each cell 22 provide the signals on the corresponding set of four lines 14 (FIG. 1). It will be seen that the equipment thus described makes it possible, in each step of the test sequence, to apply an individual 4-bit command to each I/O logic 12. As already noted, if 4-bits are employed, there may be up to 16 different commands.

Figure 3:
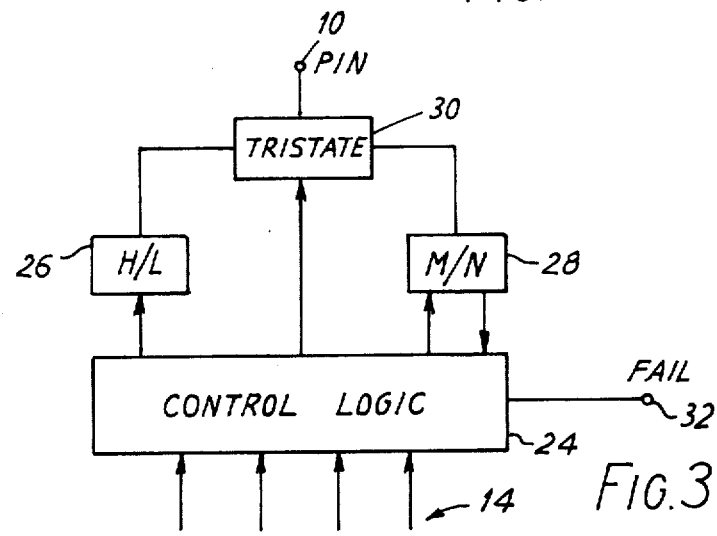
FIG. 3 shows some details of the logic associated with one test pin.

FIG. 3 illustrates one I/O logic 12 in slightly more detail. The four lines 14 are connected to control logic 24 which cooperates with input/output circuitry consisting of an H/L flip-flop 26, a monitor or neglect M/N flip-flop 28 and a tristate buffer 30 connected to the corresponding pin 10. For each step of the test sequence the control logic 24 determines the state of the tristate buffer 30 and the states of the flip-flops 26 and 28. When a pin 10 is being used as an input pin, its level will be determined by the state of the flip-flop 26. The flip-flop 28 enables a signal to be returned from the pin 10 to the control logic 24 when the flip-flop if set to the monitor state (but not when the flip-flop is set to the neglect state). The control logic 24 responds to each 4-bit control command received on the lines 14 to set the states of the flip-flops 26, 28 and the buffer 30. Moreover the control logic will, in the appropriate cases, determine whether or not the sensed level on the corresponding pin 10 is correct and, if it is not correct, provide a signal on a "fail" terminal 32. The terminals 32 may furnish interrupt signals to the programmer 20 in order that the programmer may cause a fault to be signaled or to log the occurrence of the fault and the step in the test sequence where it occurred. This aspect of operation of the equipment will not be considered in any more detail since it may be entirely conventional and forms no part of the present invention. The invention is concerned essentially with the way in which long sequences of test words are provided on selected ones of the pins 10, that is to say the way in which the corresponding H/L flip-flops 26 are toggled.

Figure 4:
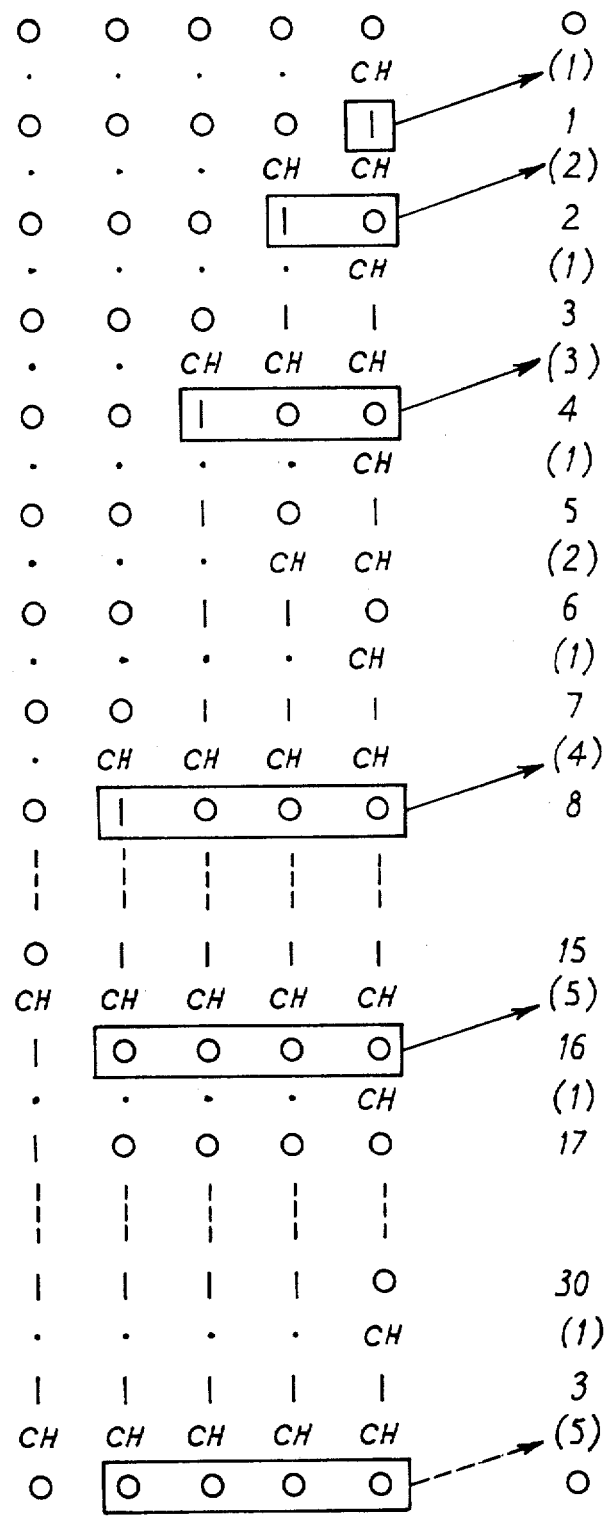
FIG. 4 is a table showing how the binary numbers 0 to 31 may be generated using only five change words.

In considering this topic attention will now be given to FIG. 4 which shows, in alternate lines the states of a 5-bit binary counter counting 0, 1, 2 ... 31. The intervening lines in the table of FIG. 4 show the change commands CH which are required to move from count to count by toggling a bit wherever CH occurs. The dots in these intervening lines represent NOP. It will be seen that, although there are 32 different count states, only five different change words are needed to effect the toggling operations, these five different words being labelled in the right hand column by the bracketed numerals (1) to (5).

Figures 5, 6, 7:
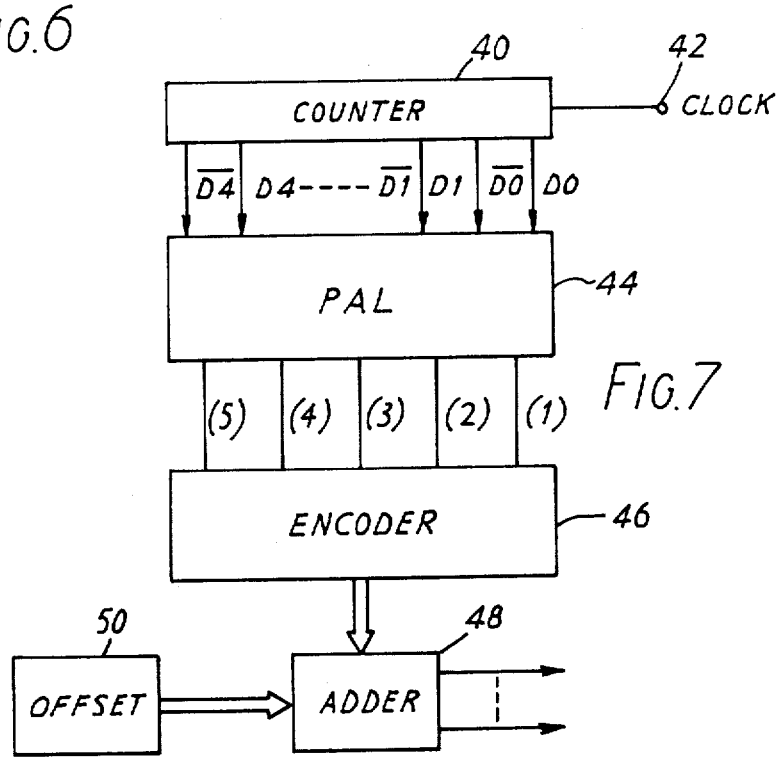
FIG. 5 shows the CH and NOP commands to be associated with an arbitrary selection of pins.
FIG. 6 shows the commands in a block of the control RAM.
FIG. 7 shows a circuit for generating the read-out addresses for the control RAM block.

Turning now to FIG. 5, five different change words can be stored, each consisting of five commands. Every command is either CH or NOP. The columns of FIG. 5 correspond to different bits of a test word and each column may be arbitrarily associated with any one of the test pins. FIG. 5 shows, purely by way of example, association of the columns with pin 3, pin 8, pin 5, pin 11 and pin 12 respectively.

FIG. 6 shows how one would proceed in practice and represents a block of the control RAM 16. However, in order to make the drawing manageable, the figure has been simplified to the case in which there are only 16 pins PIN 1 through to PIN 16. In the columns of FIG. 6 corresponding to pins 3, 5, 8, 11 and 12 the appropriate NOP and CH commands have been entered in accordance with FIG. 5. In the left hand column the bracketed numerals (1) to (5) have been employed as in FIGS. 4 and 5 but, in FIG. 6, they may be regarded as identifying the addresses for the five change words. The boxes in FIG. 6 which have been left blank can all be filled with NOP commands although it is possible, within the scope of the present invention, to make use of some other commands from the total command vocabulary available for use in the cells 22 of FIG. 2.

It is now necessary to consider the way in which the rows of FIG. 6 are addressed. As already noted above, they are not addressed in a simple cyclic sequence. By inspection from FIG. 4 the actual sequence required is; (1) (2) (1) (3) (1) (2) (1) (4) etc. Further inspection of FIG. 4 shows that each different change word is uniquely associated with a particular bit pattern in both the preceding binary count and the succeeding binary count. For example, the change word NOP NOP NOP NOP CH is associated with the least significant bit of the preceding binary count equal to zero and with the least significant bit of the succeeding binary count equal to 1. For further discussions, the second alternative has been selected and the bit patterns of the succeeding counts associated with each address have been indicated by rectangular boxes drawn around the relevant group of bits.

FIG. 7 shows addressing circuitry which makes use of detection of the bit patterns in question. This circuitry may be employed as a novel portion of the address sequencer 18 of FIG. 1. A high speed binary counter 40 has the same number of stages as there are bits in a test word. Thus, for the simple example of FIGS. 4 to 6, the counter 40 is a 5-bit counter. The counter runs through all of its states in response to clock pulses applied to a terminal 42. The least significant stage of the counter provides a non-inverted output D0 and an inverted output $\overline{D0}$ and so on. The outputs are applied to decoding logic which is preferably implemented as programmable array logic 44. The logic 44 has separate NAND/NOR combinational logic for each of the addresses (1) to (5). It is necessary to use parallel decoding for speed of operation. The nature of the logic is fully specified by and readily apparent from the following equations:

$(1) = D0$ $(2) = \overline{D0} \cdot D1$ $(3) = \overline{D0} \cdot \overline{D1} \cdot D2$ $(4) = \overline{D0} \cdot \overline{D1} \cdot \overline{D2} \cdot D3$ $(5) = \overline{D0} \cdot \overline{D1} \cdot \overline{D2} \cdot D3$ Alternatively, if it is not required to implement the change from count 31 to count 0, the decode for address (5) can follow the same pattern, i.e.

$(5) = \overline{D0} \cdot \overline{D1} \cdot \overline{D2} \cdot \overline{D3} \cdot D4$ The logic 44 has five output lines corresponding to the addresses (1) to (5) respectively. These lines are connected to an encoder 46 which provides 3-bit addresses for use in addressing the memory block of FIG. 6. Since it is desirable to be able to locate the memory block anywhere within the depth of the control RAM 16 of FIG. 1, the addresses from the encoder 46 may be added to an offset address by an adder 48. The offset address is shown as emanating from a source 50 which may be constituted in practice by the programmer 20 itself.

In summary, it can be seen that a long sequence of test words on a selection of the pins 10 of the automatic test equipment may be generated in accordance with the present invention merely by entering CH commands in the appropriate cells 22 of a block of the control RAM 16 and then selecting the addresses within this block by means of a circuit of the nature illustrated in FIG. 7. The invention is nevertheless not restricted to generation of an ordered binary sequence of test words. A random sequence may be generated by selecting the addresses within the said address block in a random manner, e.g. under control of a pseudo random generator.

The example of FIG. 4 relates to counting upwards. It is possible to count downwards using exactly the same change words and addressing sequence therefore. However, instead of commencing with all of the H/L flip-flops 26 set to 0, they will all be set initially to 1.

FIG. 8 illustrates yet another possibility. FIG. 8 is readily seen to be a modification of FIG. 5 wherein, for each address (a), there is a CH command only in the (a) bit position. There is only one CH command in each change word. It is easy to check that, if the change words of FIG. 8 are utilized in the sequence established by the address circuitry of FIG. 7, the signals on the selected pins will follow a Gray code sequence. This sequence will be the most commonly encountered version of the Gray code. Other versions are obtainable using different permutations of the five change words shown in FIG. 8.

As an alternative to the technique described above with reference to FIGS. 4 and 6 for decoding the addresses it is possible to employ a register to latch old state of the counter 40. The contents of the register and the contents of the counter may then be bit wise exclusive OR'd in order to derive a pattern of bits showing where the CH instructions are required. These bit patterns may then be decoded to determine the memory addresses.

The invention can also be used to generated sequences of words from a set of bistable devices corresponding to the H/L flips-flops described above in apparatus other than automatic test equipment.

ADVANTAGES

It is only necessary to store a small number of change words to provide a large number of test words. The change words can be set up in the control RAM to test a desired sub-set of the test pins. It is easy to address the words in the RAM in the correct sequence to pass systematically through all of the required test words for the sub-set of test pins.

We claim:

1. A machine method of generating a sequence of m-bit multibit words selected from a set N of the words, wherein m is an integer, N is a substantially larger integer not exceeding $2^m$ and the words are formed in succession in a plurality m of bistable devices, the method comprising the steps of:

(a) storing a set n of change words each of which consists of a corresponding selection of change commands, where n is a plural integer substantially smaller than n, (b) addressing a sequence of the stored change words where said sequence is larger than n and at least some of said change words appear repeatedly in said sequence, and (c) applying each addressed change word to effect changes of state of selected ones of the bistable devices in accordance with the change commands included in such change word.

2. A method according to claim 1, wherein the read-out addresses of the stored change words are provided by the steps of:

(d) continuously clocking a counter, (e) decoding predetermined states of the continuously clocked counter, and (f) generating each of the n change word addresses in response to a corresponding predetermined state.

3. A method according to claim 2, wherein the counter is a binary counter and the predetermined states are: $D0=1$, $\overline{D0} \cdot D1 = 1$, $\overline{D0} \cdot \overline{D1} \cdot D2 = 1$, and so on, where D0 and $\overline{D0}$ are the non-inverted and inverted outputs of the least significant counter stage, D1 and $\overline{D1}$ are the non-inverted and inverted outputs of the next counter stage, and so on.

4. A method according to claim 2, wherein the counter is a binary counter and the predetermined states are: $D0=0$, $\overline{D0} \, D1 = 0$, $\overline{D0} \cdot \overline{D1} \cdot D2 = 0$, and so on, where D0 and $\overline{D0}$ are the non-inverted and inverted outputs of the least significant counter stage, D1 and $\overline{D1}$ are the non-inverted and inverted outputs of the next counter stage, and so on.

5. A method according to claim 1, wherein the change words are stored in a group of addresses of a control memory in automatic test equipment as commands located, at each address, in cells of the memory pertaining to a selection of test pins of the said equipment.

6. Apparatus for generating a sequence of m-bit multi-bit words, comprising a plurality m of bistable devices, a memory storing a set of change words, each of which consists of a corresponding selection of one or more change commands, means for reading out the change words in a succession in which at least some of the words are read out a plurality of times, and means for applying the change words to the bistable devices so that each said selection of change commands causes the or each device of the corresponding selection of devices to change state.

7. Apparatus according to claim 6, wherein the means for reading out the change words comprise a counter, means for supplying clock pulses to the counter, means for decoding a plurality of predetermined states of the counter, and means for addressing the change words in corresponding with respective ones of the predetermined states.

8. Apparatus according to claim 7, wherein the counter is a binary counter and the predetermined states are $D0=B$, $\overline{D0} \cdot D1 = B$, $\overline{D0} \cdot \overline{D1} \cdot D2 = B$, and so on, where D0 and $\overline{D0}$ are the non-inverted and inverted outputs of the least significant counter stage, D1 and $\overline{D1}$ are the non-inverted and inverted outputs of the next counter stage, and so on, and B is a predetermined one of the binary values 0 and 1.

9. Automatic test equipment comprising apparatus according to claim 6, and wherein the bistable devices are a selection of such devices employed in the equipment to determine the logical level on corresponding test pins, and the memory is a control memory of the equipment.

* * * * *